United States Patent
Railkar et al.

(10) Patent No.: US 8,921,995 B1
(45) Date of Patent: Dec. 30, 2014

(54) INTEGRATED CIRCUIT PACKAGE INCLUDING A THREE-DIMENSIONAL FAN-OUT/FAN-IN SIGNAL ROUTING

(75) Inventors: Tarak A. Railkar, Plano, TX (US); Steven D. Cate, Los Altos, CA (US)

(73) Assignee: Maxim Intergrated Products, Inc., San Jose, CA (US)

( * ) Notice: Subject to any disclaimer, the term of this patent is extended or adjusted under 35 U.S.C. 154(b) by 695 days.

(21) Appl. No.: 13/183,691

(22) Filed: Jul. 15, 2011

Related U.S. Application Data

(62) Division of application No. 12/254,535, filed on Oct. 20, 2008, now Pat. No. 7,982,305.

(51) Int. Cl.
*H01L 23/04* (2006.01)

(52) U.S. Cl.
USPC .......... 257/698; 257/E23.174; 257/693; 438/125; 438/128

(58) Field of Classification Search
CPC .......... H01L 2924/01079; H01L 2924/01078; H01L 2924/15311
USPC .......... 257/E21.503, E23.067, E23.174, 692, 257/693, 696–698, 737, 738; 361/704, 707, 361/710, 764; 174/260, 261, 267; 439/66, 439/83, 91; 438/110, 128, 125
See application file for complete search history.

(56) References Cited

U.S. PATENT DOCUMENTS

| | | | |
|---|---|---|---|
| 3,795,037 A | 3/1974 | Luttmer | |
| 4,373,778 A | 2/1983 | Adham | |
| 5,216,278 A * | 6/1993 | Lin et al. | 257/688 |
| 5,355,283 A * | 10/1994 | Marrs et al. | 361/760 |
| 5,455,390 A | 10/1995 | DiStefano et al. | |
| 5,484,964 A | 1/1996 | Dawson et al. | |
| 5,531,022 A | 7/1996 | Beaman et al. | |
| 5,625,222 A * | 4/1997 | Yoneda et al. | 257/687 |
| 5,627,405 A | 5/1997 | Chillara | |
| 5,714,803 A | 2/1998 | Queyssac | |
| 5,723,369 A | 3/1998 | Barber | |
| 5,785,538 A | 7/1998 | Beaman et al. | |
| 5,796,589 A * | 8/1998 | Barrow | 361/774 |
| 5,805,426 A | 9/1998 | Merritt et al. | |
| 6,016,254 A | 1/2000 | Pfaff | |
| 6,031,292 A * | 2/2000 | Murakami et al. | 257/778 |
| 6,078,500 A | 6/2000 | Beaman et al. | |
| 6,084,295 A * | 7/2000 | Horiuchi et al. | 257/690 |
| 6,174,172 B1 | 1/2001 | Kazama | |
| 6,232,152 B1 | 5/2001 | DiStefano et al. | |

(Continued)

OTHER PUBLICATIONS

Wei Lin, Yonghao Xiu, Lingbo Zhu, Kyoung-Sik Moon, C. P. Wong; Assembling of Carbon Nanotube Structures by Chemical Anchoring for Packaging Applications; IEEE; 2008; pp. 421-426.

(Continued)

*Primary Examiner* — Chris Chu
(74) *Attorney, Agent, or Firm* — Advent, LLP

(57) ABSTRACT

An integrated circuit (IC) package is disclosed comprising a substrate including a plurality of substrate contacts; a semiconductor die including a plurality of die contacts; and a plurality of conductors for providing direct connections between substrate contacts and die contacts, respectively. By having the conductors directly route the connections between the die contacts and substrate contacts, many improvements may be realized including, but not limited to, improved package routing capabilities, reduced die and/or package size, improved package reliability, improved current handling capacity, improved speed, improved thermal performance, and lower costs.

16 Claims, 4 Drawing Sheets

(56) References Cited

U.S. PATENT DOCUMENTS

| | | |
|---|---|---|
| 6,242,803 B1 | 6/2001 | Khandros et al. |
| 6,255,727 B1 | 7/2001 | Khoury |
| 6,274,823 B1 | 8/2001 | Khandros et al. |
| 6,438,831 B1 | 8/2002 | Hagihara |
| 6,449,169 B1 * | 9/2002 | Ho et al. ............ 361/762 |
| 6,459,039 B1 | 10/2002 | Bezama et al. |
| 6,561,819 B1 | 5/2003 | Huang et al. |
| 6,784,656 B2 | 8/2004 | Breinlinger |
| 6,831,359 B2 | 12/2004 | Heilbronner |
| 6,919,645 B2 * | 7/2005 | Tian et al. ............ 257/787 |
| 7,012,325 B2 * | 3/2006 | Ahn et al. ............ 257/678 |
| 7,442,641 B2 * | 10/2008 | Beatson et al. ............ 438/667 |
| 7,714,598 B2 | 5/2010 | Eldridge et al. |
| 8,125,064 B1 * | 2/2012 | Lee et al. ............ 257/684 |
| 2006/0262822 A1 * | 11/2006 | Tatum ............ 372/38.1 |
| 2007/0204901 A1 * | 9/2007 | Dutta ............ 136/256 |

OTHER PUBLICATIONS

Franz Kreupl, Andrew P. Graham, Maik Liebau, Georg S. Duesberg, Robert Seidel, Eugen Unger; Carbon Nanotubes for Interconnect Applications; IEEE International Electron Devices Meeting; 2004; pp. 683-686.

Hongjie Dai, Jing Kong, Chongwu Zhou, Nathan Franklin, Thomas Tombler, Alan Cassell, Shoushan Fan, Michael Chapline; Controlled Chemical Routes to Nanotube Architectures, Physics, and Devices; American Chemical Society; 1999; pp. 11246-11255.

* cited by examiner

INTEGRATED CIRCUIT PACKAGE INCLUDING A THREE-DIMENSIONAL FAN-OUT/FAN-IN SIGNAL ROUTING

CROSS-REFERENCE TO RELATED APPLICATIONS

The present application is a divisional of U.S. patent application Ser. No. 12/254,535, filed Oct. 20, 2008, which is herein incorporated by reference in its entirety.

TECHNICAL FIELD

This invention relates generally to integrated circuits, and in particular, to an integrated circuit package including a three-dimensional fan-out/fan-in signal routing.

BACKGROUND

Integrated circuit (IC) packages typically include a semiconductor die (e.g., a silicon semiconductor chip) that is suitably protected. Generally, the semiconductor die includes a plurality of electrically-conductive (e.g., metal) pads for transmitting and receiving signals, supply voltages, and electrical, optical or other input parameters to and from one or more external devices. Typically, these die pads are electrically or otherwise coupled to respective pins attached to the external portion of the IC package. Usually, a complex interconnection is employed to route (e.g., fan-out and/or fan-in) the electrical connection from the semiconductor die pads to the respective pins, as exemplified below.

FIG. 1 illustrates a side sectional view of an exemplary integrated circuit (IC) package 100. The IC package 100 includes a housing consisting of a substrate 102 serving as a base of the housing, and a cover 108 mechanically or adhesively coupled to the substrate 102 in a manner to form an enclosure. Although, in this example, the cover 108 is a solid piece formed by a molding material over the substrate 102, protection covers for IC package may take on many distinct forms. The IC package 100 further includes one or more semiconductor dies 110 situated within the enclosure, and disposed on an upper surface of the substrate 102. Other surface mount components such as resistors, capacitors, inductors, etc. may also co-exist within or on the IC package 100.

The semiconductor die 110 includes on its upper surface a plurality of contact pads 112. The substrate 102 includes on its lower and external surface a plurality of contact pins 106. In this example, the plurality of pins is configured as a ball grid array (BGA). However, other types of pin configurations are used, such as land grid array (LGA), pin-grid array, etc. The substrate 102 also typically includes metalized traces and via-holes to route the interconnection from within the enclosure to the external pins 106.

Because the pitch P1 (lateral distance between adjacent pads) of the contact pads 112 is typically different than the pitch P2 (lateral distance between adjacent pins) of the external pins 106, the substrate 102 further serves as a multi-layer interconnect for fanning out the electrical connections from the contact pads 112 to the external pins 106. The contact pads 112 of the semiconductor die 110 are electrically, optically or otherwise coupled to the multi-layer interconnect of the substrate 102 via a plurality of wirebonds 116. The multi-layer interconnect of the substrate 102 is electrically coupled to the external pins 106 by means of metalized via-holes and metal traces as illustrated.

There are several drawbacks with this IC package configuration. First, although the substrate 102 helps with fan-out and fan-in, the size, complexity and hence cost of the package is limited by the line/space capabilities of the substrate fabrication process, pitch and the number of interconnects on the die 110 and on the IC package 100. Typically, many routing layers are required to connect all the pins 112 on the die 110 to the corresponding pins 106 of the package 100, while simultaneously keeping the package size relatively small. Complex routing schemes on the substrate 102 increases its cost and generally increases the reliability risk of the IC package 100. Current carrying capacity of the IC package 100 could also be limited, and due to parasitic capacitance and inductance thereof, the frequency of the signals processed by the IC package may likewise be limited.

FIG. 2A illustrates a side sectional view of another exemplary integrated circuit (IC) package 200. The IC package 200 is similar to the previously-discussed IC package 100, and includes the same or similar elements as noted by the same reference numbers with a most significant digit as a "2" instead of a "1." For example, the IC package 200 includes contact pins 206 and cover 208. The IC package 200 differs from package 100 in that it is in a flip-chip configuration. That is, the semiconductor die 210 is flipped up-side-down such that its contact pads 212 are facing towards the substrate 202. In this configuration, the contact pads 212 make direct connection to the multi-layered interconnect of the substrate 202. Although the flip-chip configuration eliminates the wirebonds of the previous IC package 100, it still experiences challenges similar to those for the wirebond package configuration previously discussed.

FIG. 2B illustrates a side sectional view of yet another exemplary integrated circuit (IC) package 250. The IC package 250 is similar to the previously-discussed IC package 200, and includes the same or similar elements as noted by the same reference numbers. The IC package 250 differs from package 200 in that the contacts 220 of the semiconductor die 210 are configured as miniature balls, typically made from solder or other suitable conductive materials, instead of flat contact pads 212. Nonetheless, the IC package 250 still experiences challenges similar to those previously discussed with reference to IC package 100.

SUMMARY

An aspect of the invention relates to an integrated circuit (IC) package comprising a substrate including a plurality of substrate contacts; a semiconductor die including a plurality of die contacts; and a plurality of conductors for directly (i.e., via a substantially single medium) routing connections between substrate contacts and die contacts, respectively. By having the conductors directly route the connections between the die contacts and substrate contacts, many improvements may be realized including, but not limited to, improved package routing capabilities, reduced die and/or package size, improved package reliability, improved current handling capacity, improved speed, improved thermal performance, and lower costs.

In another aspect, each of the conductors may comprise a wire-like conductor made out of a suitable electrical-conductive material, such as gold (Au), copper (Cu), aluminum (Al), or other suitable material. In another aspect, some or all of the conductors may comprise a carbon nano-tube, or other similar conductive material. In yet another aspect, each of the conductors may be adapted to route optical signals, like in the case where each conductor is a light-guide, such as a fiber optic cable. In still another aspect, the IC package may include a support structure for protecting and providing mechanical support for the conductors. The support structure may comprise an epoxy, semiconductor or insulating material.

In another aspect, each of the substrate contacts may comprise an external contact situated on an external surface of the substrate, and an electrically-conductive via hole electrically coupled to the external contact. The external contacts may be configured as a ball grid array (BGA), land grid array (LGA), pin-grid array, or other such configuration. In yet another aspect, the semiconductor die may be oriented in a flip-chip manner, where the die contacts are on the side of the semiconductor die facing the substrate. In still another aspect, the semiconductor die may be oriented in a manner where the die contacts are on the side of the semiconductor die oppositely facing the substrate.

In another aspect, the semiconductor die may comprise silicon (Si), silicon-germanium (SiGe), gallium arsenide (GaAs), silicon carbide (SiC), silicon nitride ($Si_3N_4$), or other semiconductor materials. In yet another aspect, the substrate may comprise a ceramic, glass, silicon, Flame Retardant 4 (FR4), Flame Retardant 5 (FR5), polyimide (PI), or other materials. In still another aspect, the IC package may comprise a cover or protective material mechanically coupled or adhesively attached to the substrate in a manner to form an enclosure, wherein the semiconductor die and conductors are situated within the enclosure. In still another aspect, the IC package may comprise one or more electronic, photonic, or optoelectronic devices adapted to transmit or receive electrical or optical signals to or from the semiconductor die via the die contacts and substrate contacts. In another aspect, the semiconductor may be connected directly without the use of any conventional substrate materials.

Other aspects, advantages and novel features of the present invention will become apparent from the following detailed description of the invention when considered in conjunction with the accompanying drawings.

DETAILED DESCRIPTION

Figure 1:
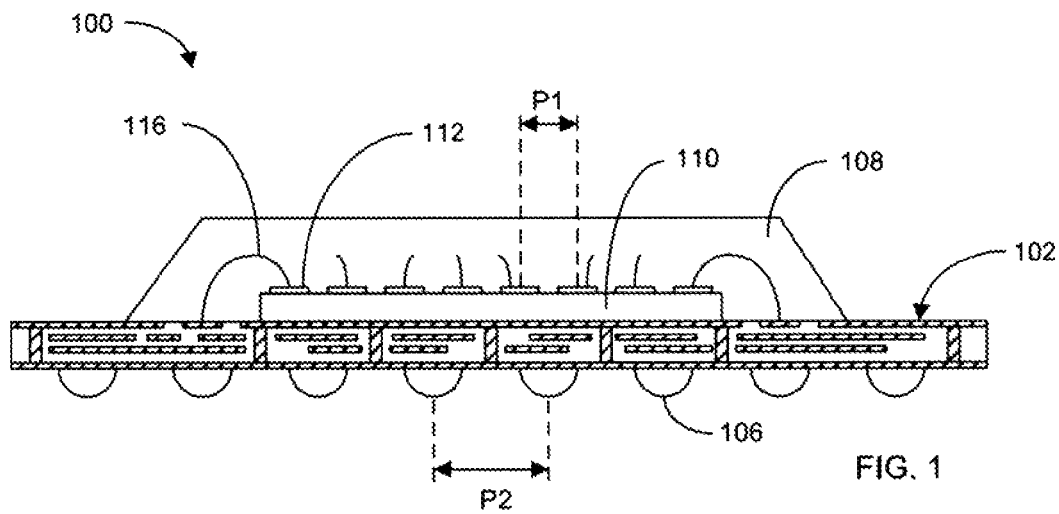
FIG. 1 illustrates a side sectional view of an exemplary integrated circuit package.
Figure 2A:
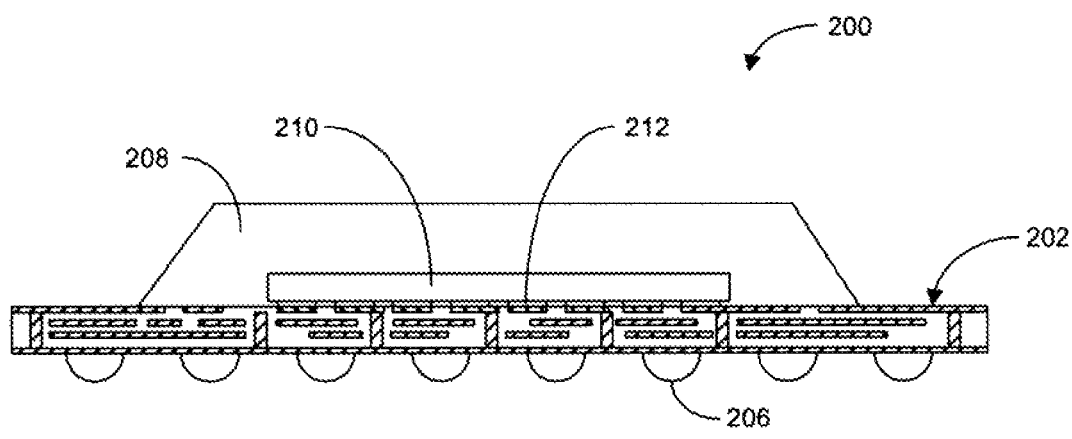
FIGS. 2A-B illustrate sectional views of other exemplary integrated circuit packages, respectively.
Figure 2B:
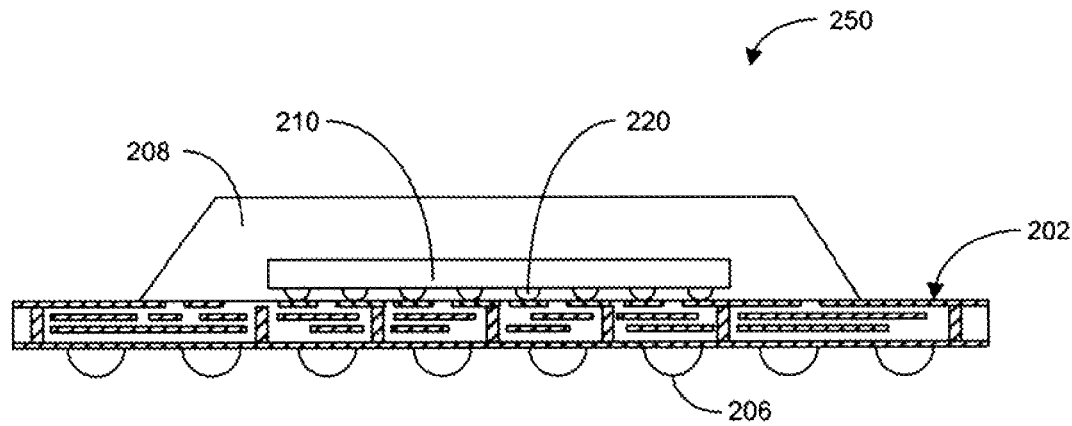
Figure 3:
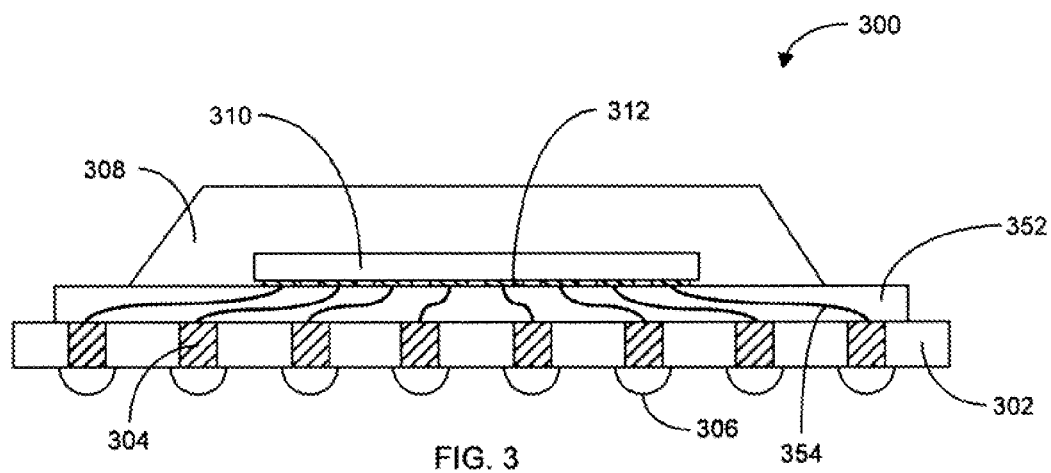
FIG. 3 illustrates a sectional view of an exemplary integrated circuit package in accordance with an embodiment of the invention.

FIG. 3 illustrates a sectional view of an exemplary integrated circuit (IC) package 300 in accordance with an embodiment of the invention. In summary, the IC package 300 includes an interconnect structure that provides direct electrical connection routing between the contact pads of a semiconductor die and the contacts of the substrate of the IC package. With this IC package configuration, the substrate design and package construction can be significantly simplified. Accordingly, the IC package 300 has many advantages over the previously-discussed IC packages, including improved package routing capabilities, reduced die and/or package size, improved package reliability, improved current handling capacity, improved speed, improved thermal performance, and lower costs, among other benefits as explained in more detail below.

In particular, the IC package 300 comprises a substrate 302 and a cover or protective material 308 mechanically coupled or adhesively attached to the substrate 302 in a manner that forms an enclosure. In this example, the cover 308 may be formed of a molded material or other materials. The substrate 302 may be made of any suitable material, such as ceramic, glass, silicon, Flame Retardant 4 (FR4), Flame Retardant 5 (FR5), polyimide (PI), and others. The substrate 302 includes a plurality of external contacts 306, which may be configured as a ball grid array (BGA), disposed on its external surface to provide a means for electrically interfacing the IC package 300 with other devices. Often, the IC package 300 is attached to a printed circuit board (PCB) by soldering the external contacts 306 to corresponding contacts of the PCB. The substrate 302 further comprises a plurality of electrically-conductive (e.g., metalized) via holes 304 electrically coupled to the external contacts 306, respectively. The electrically-conductive via holes 304 route electrical connection between the interior and exterior of the IC package 300. Although, in this example, the cover 308 is made of a molded material, it shall be understood that the cover may have many distinct constructions.

The IC package 300 further comprises a semiconductor die 310 situated within the package enclosure, and including a plurality of contact pads 312 disposed on one side of the die. In this example, the IC package 300 is configured in a flip-chip manner by having the die contacts 312 on the side of the semiconductor die 310 that substantially faces the substrate 302. It shall be understood that the IC package 300 may be configured in other manners, some of which are discussed further herein. The semiconductor die 310 may be made of any suitable material, such as silicon (Si), silicon-germanium (SiGe), gallium-arsenide (GaAs), silicon carbide (SiC), silicon nitride ($Si_3N_4$), and others. The integrated circuit package 300 may be configured with a single semiconductor die 310 as shown in FIG. 3, or may be configured with multiple device dies and/or passive components.

To provide the direct electrical connection routing from the semiconductor die contacts 312 to the contacts of the substrate 302, the IC package 300 further comprises a plurality of substantially flexible interconnects 354 (e.g., wire-like electrical conductors) situated within the package enclosure. Each flexible interconnect 354 includes a first end that electrically connects to a corresponding contact 312 of the semiconductor die 310, and a second end that electrically connects to the electrically-conductive via hole 304 of the substrate 302. The flexible interconnects 354 may be each made out of a suitable electrical conductor, such as gold (Au), copper (Cu), carbon nano-tubes, and others. As discussed with respect to another exemplary embodiment, the flexible interconnects 354 may be configured as light-guides, such as fiber optic cables. The IC package 300 may further comprise a support structure 352, such as an epoxy, semiconductor or insulating material for protecting and providing mechanical support for the interconnects 354 in order to prevent short circuits and wire detachment.

As previously discussed, the IC package 300 provides a much more efficient use of the space within the package by providing a direct electrical connection routing (i.e., a substantially single conductive medium) between the semiconductor die contacts 312 and the contacts of the substrate 302. As discussed, the substrate 302 need not have a complex, multi-layer routing to provide the electrical connection between the die contacts and the substrate contacts. This makes the package less complex, hence cheaper and also improves the reliability performance of the package. The thickness of the conductors 354 may be configured in order to handle the necessary current flow to and from the semiconductor die 310. Additionally, the thickness of the wires 354 may also be configured to provide thermal management of the IC package during operation.

Figure 4:
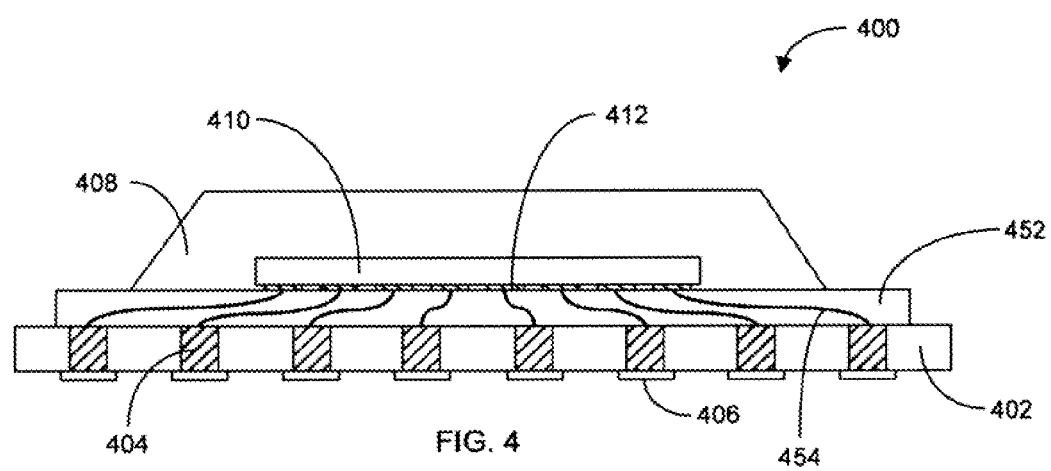
FIG. 4 illustrates a sectional view of another exemplary integrated circuit package in accordance with another embodiment of the invention.

FIG. 4 illustrates a sectional view of another exemplary integrated circuit (IC) package 400 in accordance with another embodiment of the invention. The IC package 400 is similar to the previously-discussed embodiment 300, and includes many of the same or similar elements as noted by the same reference numbers except the most significant digit is a "4" instead of a "3." For instance, the IC package 400 comprises a substrate 402 including external contacts 406 and electrically-conductive via holes 404, a cover or protective material 408, a semiconductor die 410 including contact pads 412, and a plurality of conductors 454 protected and supported by a support structure 452. The IC package 400 differs from the package 300 in that the substrate 402 includes external contacts 406 configured as a land grid array (LGA), instead of a BGA. It shall be understood that the external contacts of the IC packages 300 and 400 may be configured in many different ways.

Figure 5:
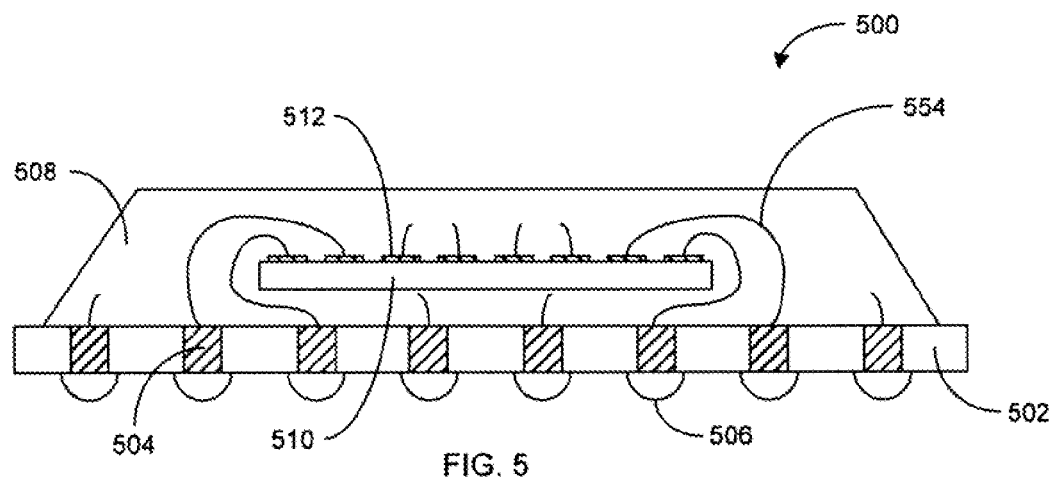
FIG. 5 illustrates a sectional view of another exemplary integrated circuit package in accordance with another embodiment of the invention.

FIG. 5 illustrates a sectional view of another exemplary integrated circuit (IC) package 500 in accordance with another embodiment of the invention. The IC package 500 is similar to the previously-discussed embodiment 300, and includes many of the same or similar elements as noted by the same reference numbers except the most significant digit is a "5" instead of a "3." For instance, the IC package 500 comprises a substrate 502 including external contacts 506 and electrically-conductive via holes 504, a cover or protective material 508, a semiconductor die 510 including contact pads 512, and a plurality of conductors 554. The IC package 500 differs from the package 300 in that the semiconductor die 510 is oriented such that its contacts 512 face away or in the opposite direction of the substrate 502 (e.g., in a non-flip-chip manner). It shall be understood that the semiconductor die 510 may be oriented and configured in many different ways. Additionally, the IC package 500 does not include a support structure for the semiconductor 510. A support structure for the semiconductor 510 is optional in any of the embodiments described herein.

Figure 6:
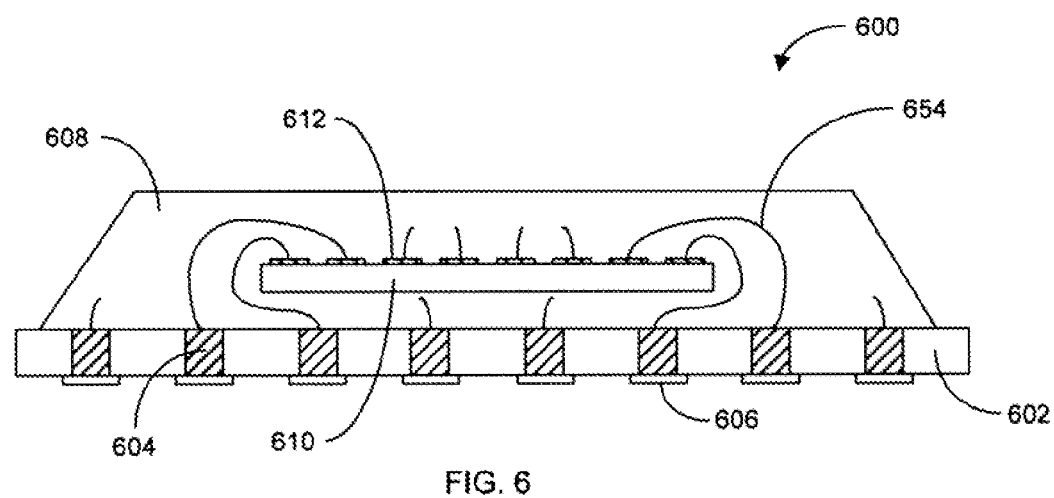
FIG. 6 illustrates a sectional view of another exemplary integrated circuit package in accordance with another embodiment of the invention.

FIG. 6 illustrates a sectional view of another exemplary integrated circuit (IC) package 600 in accordance with another embodiment of the invention. The IC package 600 is similar to the previously-discussed embodiment 500, and includes many of the same or similar elements as noted by the same reference numbers except the most significant digit is a "6" instead of a "5." For instance, the IC package 600 comprises a substrate 602 including external contacts 606 and electrically-conductive via holes 604, a cover or protective material 608, a semiconductor die 610 including contact pads 612, and a plurality of conductors 654. The IC package 600 differs from the package 500 in that the substrate 502 includes external contacts 506 configured as an LGA, instead of a BGA. It shall be understood that the external contacts of any of the IC packages described herein may be configured in many different ways.

Figure 7:
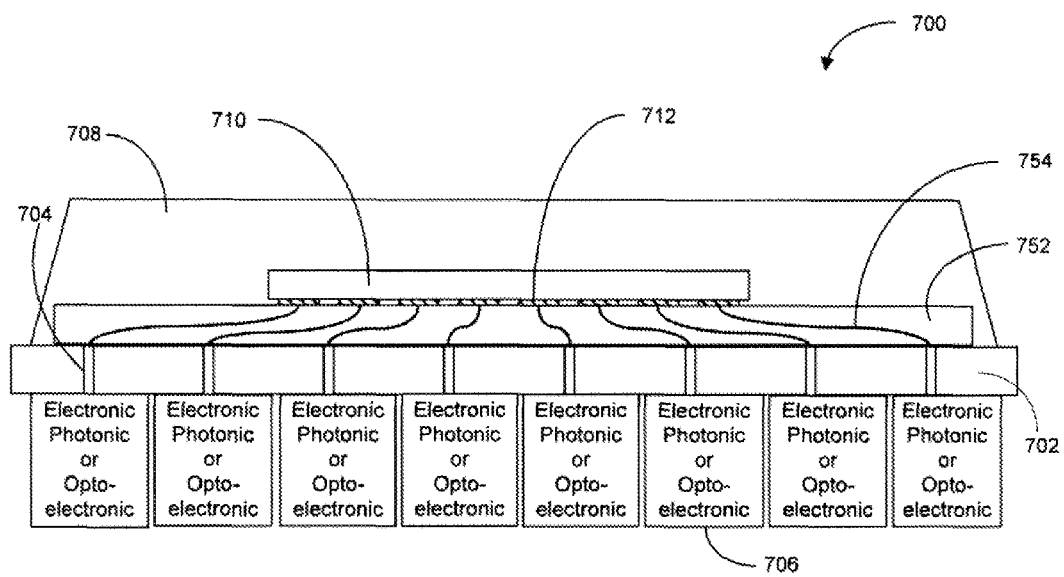
FIG. 7 illustrates a sectional view of another exemplary integrated circuit package in accordance with another embodiment of the invention.

FIG. 7 illustrates a sectional view of another exemplary integrated circuit (IC) package 700 in accordance with another embodiment of the invention. The IC package 700 is configured for handling optical signals. In particular, the IC package 700 comprises a substrate 702 including a plurality of contacts 704 for routing optical and/or electrical signals. The IC package 700 further comprises a cover or protective material 708 mechanically coupled or adhesively attached to the substrate 702 in a manner that forms an enclosure. The IC package 700 further includes a semiconductor die 710 oriented in a flip-chip manner with contacts 712 substantially facing the substrate 702.

The IC package 700 further includes a plurality of optical and/or electrical signal conductors 754 for directly routing a connection between the conductors 712 of the die 712 and the conductors 704 of the substrate 702. Each optical/electrical conductor 754 includes a first end coupled to a corresponding contact 712 of the semiconductor die 710, and a second end coupled to a corresponding optical/electrical contact 704. For example, the conductor 754 may be configured as a fiber optic cable for routing optical signals between the semiconductor die 710 and one or more external devices. Or, the conductor 754 may be an electrical conductor for routing electrical signals between the semiconductor die 710 and one or more external devices. Or, the conductor 754 may be configured to route both optical and electrical signals. The optical/electrical conductor 754 along with the semiconductor die 710 may be supported and protected by a support structure 752 (e.g., an epoxy, semiconductor or insulating material).

The IC package 700 further includes one or more electronic, photonic or optoelectronic devices 706 attached to the external side of the substrate 702, and optically and/or electrically coupled to the conductors 704, respectively. The devices 706 may be configured to generate and/or process optical and/or electrical signals for transmission to and from the semiconductor die 710 via the conductors 704 and 754. Although the IC package 700 is configured in a flip-chip manner, it shall be understood that the IC package 700 may be configured in a similar fashion as that of the previous embodiments. As previously discussed, because the signal conductors 754 directly route the connection between the semiconductor die contacts 712 and the contacts 704 of the substrate 702, many benefits are realized in reliability, manufacturing, costs, size reduction, and performance of the IC package 700.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An integrated circuit (IC) package, comprising:
   a substrate including a plurality of electrical contacts configured to electrically connect the integrated circuit (IC) package to an external device and a plurality of electrically-conductive via holes extending through the substrate, each of the electrically-conductive via holes electrically coupled to an external contact;
   an encapsulation layer configured to form an enclosure, the encapsulation layer comprising a protective material;
   a semiconductor die disposed in the enclosure, the semiconductor die including a plurality of die contacts, the semiconductor die oriented such that the die contacts are on a side of the semiconductor die facing away from the substrate, where the protective material is disposed between the semiconductor die and the substrate so that the semiconductor die is not mounted to the substrate; and a plurality of interconnects, each of the interconnects having a first end electrically coupled to a die contact and a second end electrically coupled to an electrically-conductive via hole.

2. The IC package of claim 1, wherein the plurality of interconnects comprises a wire conductor.

3. The IC package of claim 2, wherein the wire conductor comprises gold (Au), copper (Cu), or aluminum (Al).

4. The IC package of claim 1, wherein the plurality of interconnects comprises a carbon nano-tube.

5. The IC package of claim 1, wherein the plurality of interconnects are configured to route an optical signal.

6. The IC package of claim 5, wherein the plurality of interconnects comprises a fiber optic cable.

7. The IC package of claim 1, wherein the external contact is part of a ball grid array (BGA), a land grid array (LGA) or a pin-grid array.

8. The IC package of claim 1, wherein the semiconductor die comprises silicon (Si), silicon germanium (SiGe), or gallium arsenide (GaAs), silicon carbide (SiC), or silicon nitride (Si3N4).

9. The IC package of claim 1, wherein the substrate comprises ceramic, glass, silicon, Flame Retardant 4 (FR4), Flame Retardant 5 (FR5), or polyimide (PI).

10. The IC package of claim 1, wherein the encapsulation layer comprises a protective material configured to encapsulate the semiconductor die.

11. The IC package of claim 10, wherein the plurality of interconnects are at least substantially flexible.

12. The IC package of claim 1, wherein the encapsulation layer comprises a molded material configured to form a protective enclosure for the semiconductor die.

13. An integrated circuit (IC) package, comprising:
a substrate including a plurality of substrate contacts configured to electrically connect the integrated circuit (IC) package to an external device, each of the substrate contacts including an external contact situated on an external surface of the substrate and an electrically-conductive via hole extending through the substrate, the electrically-conductive via hole electrically coupled to the external contact;
a cover or protective material forming an enclosure;
a semiconductor die including a plurality of die contacts, wherein the semiconductor die is situated within the enclosure, the semiconductor die oriented such that the die contacts face substantially away from the substrate, where the protective material is disposed between the semiconductor die and the substrate so that the semiconductor die is not mounted to the substrate; and
a plurality of interconnects, each of the interconnects having a first end electrically coupled to a die contact and a second end electrically coupled to an electrically-conductive via hole.

14. The IC package of claim 13, wherein the substrate contacts comprise a ball grid array (BGA), a land grid array (LGA), or a pin-grid array.

15. The IC package of claim 13, wherein the plurality of interconnects are configured to conduct electrical or optical signals.

16. An integrated circuit (IC) package, comprising:
a substrate including a plurality of substrate contacts configured to electrically connect the integrated circuit (IC) package to an external device, each of the substrate contacts including an external contact situated on an external surface of the substrate and an electrically-conductive via hole extending through the substrate, the electrically-conductive via hole electrically coupled to the external contact;
a cover or protective material mechanically coupled or attached to the substrate to form an enclosure;
a semiconductor die including a plurality of die electrical contacts, wherein the semiconductor die is situated within the enclosure, the semiconductor die oriented such that the die contacts face substantially away from the substrate, where the protective material is disposed between the semiconductor die and the substrate so that the semiconductor die is not mounted to the substrate;
a plurality of interconnects, each of the interconnects having a first end electrically coupled to a die contact and a second end electrically coupled to an electrically-conductive via hole.

* * * * *